(12) United States Patent
Meyer et al.

(10) Patent No.: US 6,898,138 B2
(45) Date of Patent: May 24, 2005

(54) METHOD OF REDUCING VARIABLE RETENTION CHARACTERISTICS IN DRAM CELLS

(75) Inventors: Russell L. Meyer, Boise, ID (US); Ray Beffa, Star, ID (US)

(73) Assignee: Micron Technology, Inc., Boise, ID (US)

( * ) Notice: Subject to any disclaimer, the term of this patent is extended or adjusted under 35 U.S.C. 154(b) by 420 days.

(21) Appl. No.: 10/230,594

(22) Filed: Aug. 29, 2002

(65) Prior Publication Data

US 2004/0042306 A1 Mar. 4, 2004

(51) Int. Cl.$^7$ ............................................. G11C 7/04
(52) U.S. Cl. ..................................... 365/211; 365/149
(58) Field of Search ................... 365/211, 212, 365/149, 222

(56) References Cited

U.S. PATENT DOCUMENTS

| | | | |
|---|---|---|---|
| 5,657,284 A | 8/1997 | Beffa | 365/201 |
| 5,680,359 A * | 10/1997 | Jeong | 708/620 |
| 5,754,486 A | 5/1998 | Nevill et al. | 365/201 |
| 5,844,803 A | 12/1998 | Beffa | 364/468.28 |
| 5,852,581 A | 12/1998 | Beffa et al. | 365/201 |
| 5,867,505 A | 2/1999 | Beffa | 371/21.1 |
| 5,885,846 A | 3/1999 | Beffa | 438/18 |
| 5,898,186 A | 4/1999 | Farnworth et al. | 257/48 |
| 5,898,629 A | 4/1999 | Beffa et al. | 365/201 |
| 5,910,921 A | 6/1999 | Beffa et al. | 365/201 |
| 5,915,231 A | 6/1999 | Beffa | 702/118 |
| 5,927,512 A | 7/1999 | Beffa | 209/573 |
| 5,965,902 A | 10/1999 | Beffa | 257/48 |
| 5,966,025 A | 10/1999 | Beffa | 324/765 |
| 5,976,899 A | 11/1999 | Farnworth et al. | 438/14 |
| 5,982,682 A | 11/1999 | Nevill et al. | 365/201 |
| 5,994,915 A | 11/1999 | Farnworth et al. | 324/765 |
| 6,003,149 A | 12/1999 | Nevill et al. | 714/718 |
| 6,032,264 A | 2/2000 | Beffa et al. | 714/7 |
| 6,058,056 A | 5/2000 | Beffa et al. | 365/201 |
| 6,067,507 A | 5/2000 | Beffa | 702/118 |
| 6,079,037 A | 6/2000 | Beffa et al. | 714/720 |
| 6,094,734 A | 7/2000 | Beffa et al. | 714/718 |
| 6,100,486 A | 8/2000 | Beffa | 209/573 |
| 6,118,138 A | 9/2000 | Farnworth et al. | 257/48 |
| 6,119,251 A | 9/2000 | Cloud et al. | 714/718 |
| 6,122,563 A | 9/2000 | Beffa | 700/121 |
| 6,128,756 A | 10/2000 | Beffa | 714/718 |
| 6,145,092 A | 11/2000 | Beffa et al. | 714/7 |
| 6,147,316 A | 11/2000 | Beffa | 209/573 |
| 6,181,154 B1 | 1/2001 | Beffa | 324/765 |
| 6,208,947 B1 | 3/2001 | Beffa | 702/118 |
| 6,233,185 B1 | 5/2001 | Beffa et al. | 365/201 |
| 6,292,009 B1 | 9/2001 | Farnworth et al. | 324/765 |
| 6,307,171 B1 | 10/2001 | Beffa | 209/573 |
| 6,313,658 B1 | 11/2001 | Farnworth et al. | 324/765 |
| 6,324,088 B1 | 11/2001 | Keeth et al. | 365/51 |
| 6,347,386 B1 | 2/2002 | Beffa | 714/718 |
| 6,350,959 B1 | 2/2002 | Beffa | 209/573 |
| 6,363,329 B2 | 3/2002 | Beffa | 702/118 |
| 6,365,860 B1 | 4/2002 | Beffa | 209/573 |
| 6,365,861 B1 | 4/2002 | Beffa | 209/573 |
| 6,373,011 B1 | 4/2002 | Beffa | 209/573 |
| 6,424,168 B1 | 7/2002 | Farnworth et al. | 324/765 |
| 6,437,271 B1 | 8/2002 | Beffa | 209/573 |
| 6,442,719 B1 | 8/2002 | Beffa et al. | 714/721 |
| 6,452,415 B1 | 9/2002 | Farnworth et al. | 324/765 |
| 6,477,662 B1 | 11/2002 | Beffa et al. | 714/7 |
| 6,762,966 B1 * | 7/2004 | LaRosa et al. | 365/201 |

FOREIGN PATENT DOCUMENTS

| | | | | |
|---|---|---|---|---|
| JP | 06338514 A | * | 12/1994 | H01L/21/331 |
| JP | 08264548 A | * | 11/1996 | H01L/21/322 |

* cited by examiner

*Primary Examiner*—Tan T. Nguyen
(74) *Attorney, Agent, or Firm*—Fletcher Yoder

(57) ABSTRACT

The illustrated embodiments relate to reducing variable retention time in dynamic random access memory (DRAM) integrated circuit devices. Memory cells that comprise the DRAM device are placed in a reverse bias condition. While under reverse bias, the DRAM device is maintained at an elevated temperature for a predetermined time.

24 Claims, 5 Drawing Sheets

METHOD OF REDUCING VARIABLE RETENTION CHARACTERISTICS IN DRAM CELLS

BACKGROUND OF THE INVENTION

1. Field of the Invention

The present invention relates generally to improving the performance of integrated circuit components and, more particularly, to reducing variation in dynamic random access memory (DRAM) cell retention time.

2. Background of the Related Art

This section is intended to introduce the reader to various aspects of art, which may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Integrated circuits are used in a wide variety of applications throughout the world. Such applications include personal computers, control systems, telephone networks, and a host of other consumer products. Memory devices, such as dynamic random access memory (DRAM) integrated circuits, may be used for storing information in electronic devices. As the speed of microprocessor-based circuits increases, demand increases for high speed memory devices, which require increasingly fast and accurate timing and control.

Memory manufacturers, such as the assignee of the present invention, provide an array of innovative fast memory chips for various applications. DRAM, which is widely used, is relatively inexpensive to manufacture compared to other types of memory (for example, static random access memory). One disadvantage of DRAM, however, is that the data stored in DRAM must constantly be re-written or "refreshed" or the data will be lost. For this reason, DRAM is considered to be "volatile." Other types of memory that maintain data permanently are referred to as "non-volatile" memory. The lower cost and higher density of DRAM make it an excellent choice for applications that require relatively large amounts of memory, such as computer systems.

Each DRAM is comprised of a very large number of individual memory cells. There may be millions of these memory cells in a single DRAM integrated circuit device. Each individual memory cell holds one bit of information, which may be a logical low ("0") or a logical high ("1"). Bit is short for "binary digit" and is the basic data unit in personal computers and other microprocessor-based systems. The memory cells each comprise a transistor and a capacitor. The memory cells are arranged in rows and columns, with the rows are word lines (RB) connected to a bitline, and the columns are bitlines (RB) connected to a wordline. The capacitor is either charged (a logical "1" in most systems) or discharged (a logical "0" in most systems). A DRAM cell may also be referred to as a "DRAM bit" because each cell holds one bit.

To store a "1" in a memory cell, the corresponding capacitor is depleted of electrons (or positively charged). To store a "0", the capacitor is not charged (RB). One problem is that capacitors tend to leak over time. Depending on its physical characteristics, a full capacitor can become empty (or discharged) in a relatively short time (about 64 milliseconds). Therefore, for dynamic memory to work, either the microprocessor (central processing unit or CPU) or a memory controller must repeatedly recharge or refresh all of the capacitors holding a charge (i.e. "1") before the capacitors discharge. To do this, the memory controller or CPU may read the data stored in each memory cell and then write the data that it read back into the corresponding memory cell. This refresh operation is where DRAM gets its name. DRAM must be dynamically refreshed or it loses the data that it is holding.

Refresh circuits may operate on entire rows of memory cells. This eliminates the need of having to refresh each memory cell individually. During a refresh cycle, the refresh circuit may read out and write back an entire row of memory in a single operation. The transistor in each DRAM cell acts as a switch that lets the refresh circuitry on the DRAM chip read the capacitor or change the capacitor's state.

Inherent defects in the DRAM cell transistors are believed to cause variation in the length of time that the capacitor and thus the overall DRAM cell retains a charge. Significant research and development has been devoted to reducing variability in DRAM charge retention time caused by transistor defects.

The retention time, or length of time that a DRAM cell may hold a charge before needing to be refreshed, is typically measured in milliseconds and is sometimes called refresh time. In a typical DRAM cell, retention time tends to decrease as ambient temperature increases. Ideally, however, retention time of a DRAM cell should remain constant at a given temperature. Unfortunately, external factors such as time are believed to affect retention time in some DRAM cells. For example, some DRAM cells are believed to experience changes in retention time as time passes (even at a constant temperature). This variability in retention time is undesirable.

Predictability and consistency of retention time is important in being able to accurately quantify the performance of DRAM devices. If the retention time for cells of a DRAM device change over time or temperature, it may be hard to specify a guaranteed minimum refresh rate for the device. This problem is complicated by the fact that the retention times for some cells in a DRAM device may vary while the retention time for other memory cells remains more or less constant. Unless the DRAM device is refreshed at a rate that is shorter than the minimum retention time of any of the memory cells under any conditions, data stored in the DRAM device may potentially be lost. This problem is accentuated by the fact that variations in retention time for DRAM cells are not predictable. Because DRAM devices may have millions of individual cells, identifying the shortest retention time of any of the cell in the entire device, or even the conditions that cause the lowest retention time to occur, may be impossible to determine. Picking a needlessly short retention time to account for possible variations in individual memory cells is not an effective option because an unduly short retention time means that the circuitry that performs the refresh operation will be operating more frequently and consuming more power than necessary.

One theory about the cause of variable retention time is that imperfections in the transistor semi-conductor material contribute to the variation. More specifically, mobile defects in the transistor p-n junction may cause the variation. These junctions are basic building blocks in many integrated circuit devices, so the same factors that cause variable retention time may also be responsible for creating problems in the operation of other semiconductor devices as well. Whatever the cause, variation in retention time is undesirable, and a method of reducing the incidence of variable retention time in DRAM cells is desirable.

BRIEF DESCRIPTION OF THE DRAWINGS

Advantages of the invention may become apparent upon reading the following detailed description and upon reference to the drawings in which.

DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
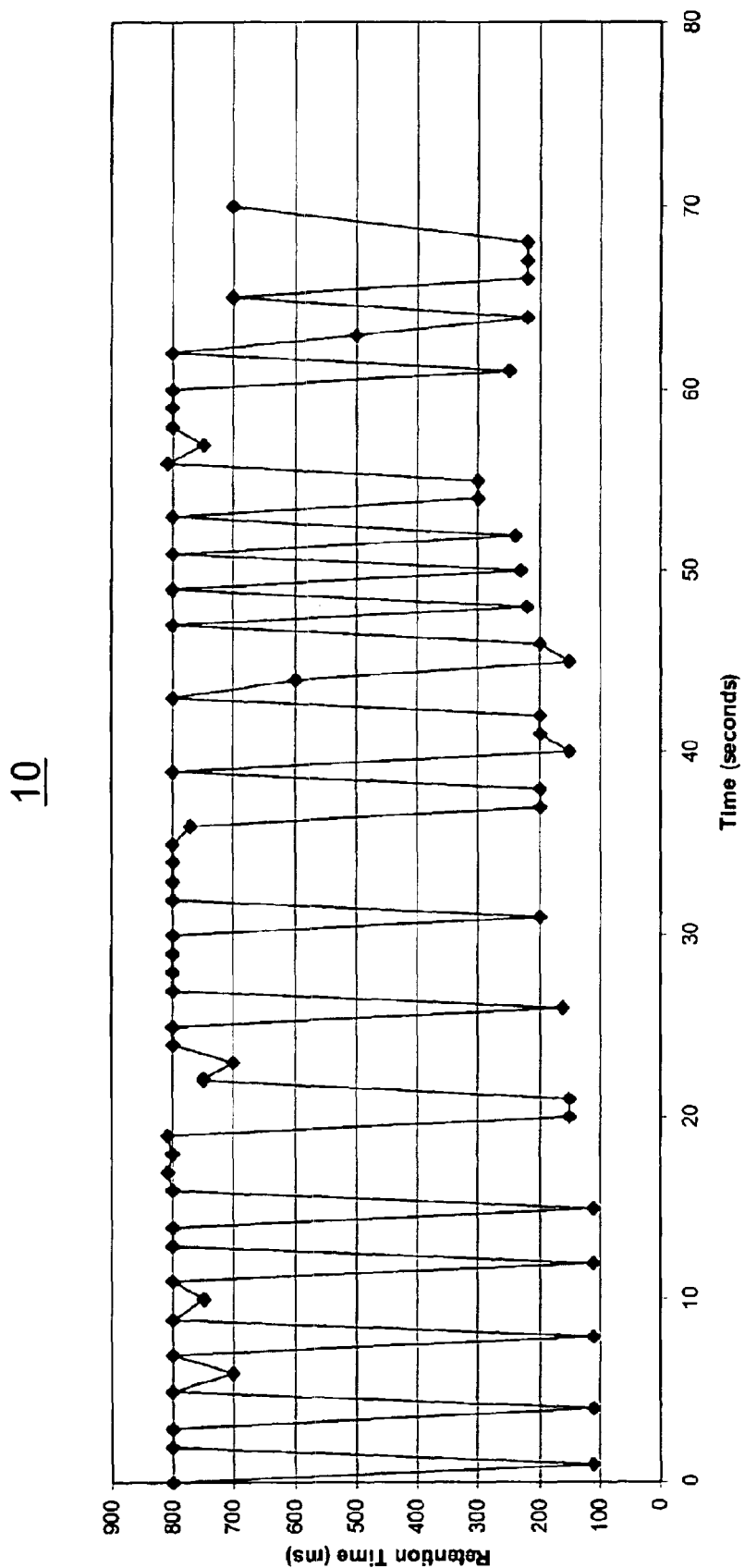
FIGS. 1–3 are graphical representations showing examples of how retention time in metallurgical sets or DRAM cells may vary in response to external stimuli.
Figure 2:
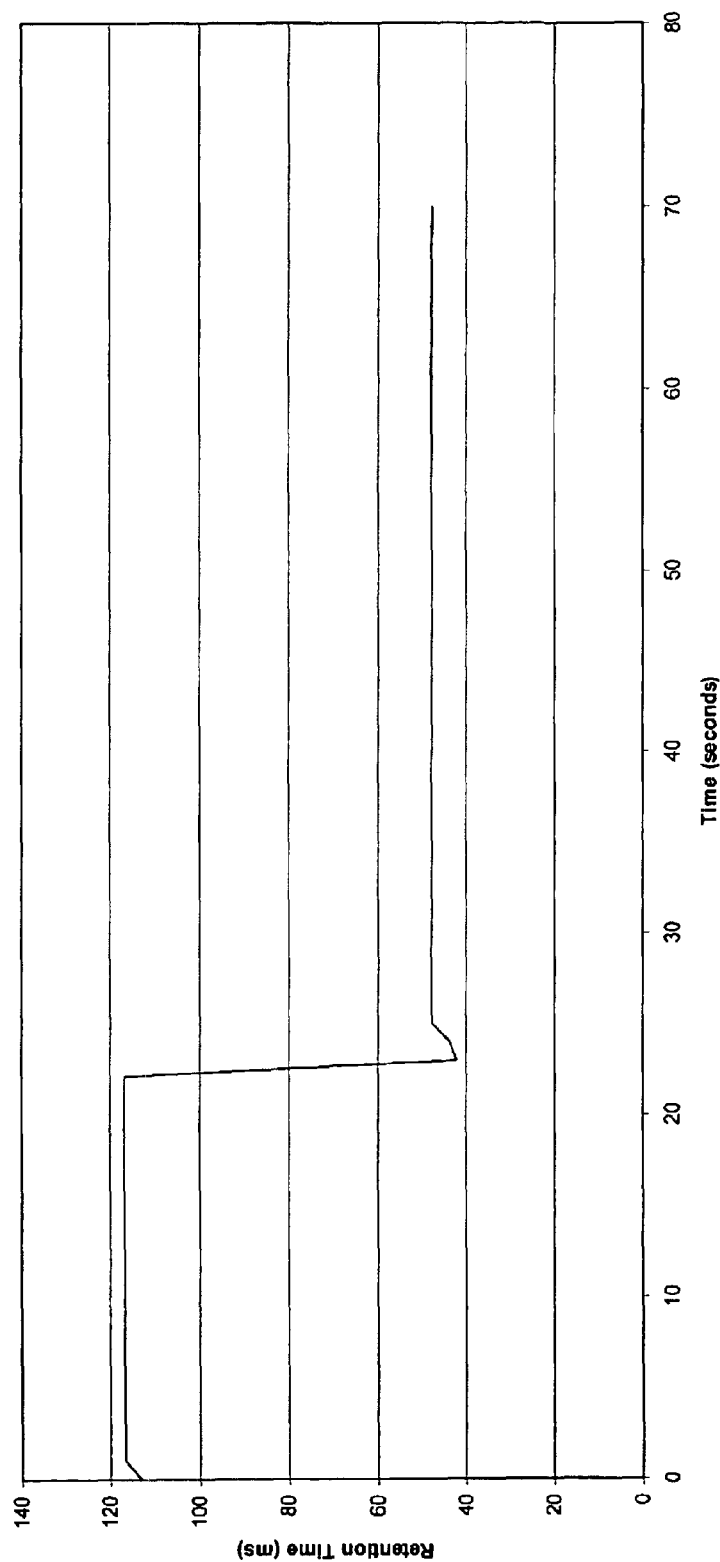
Figure 3:
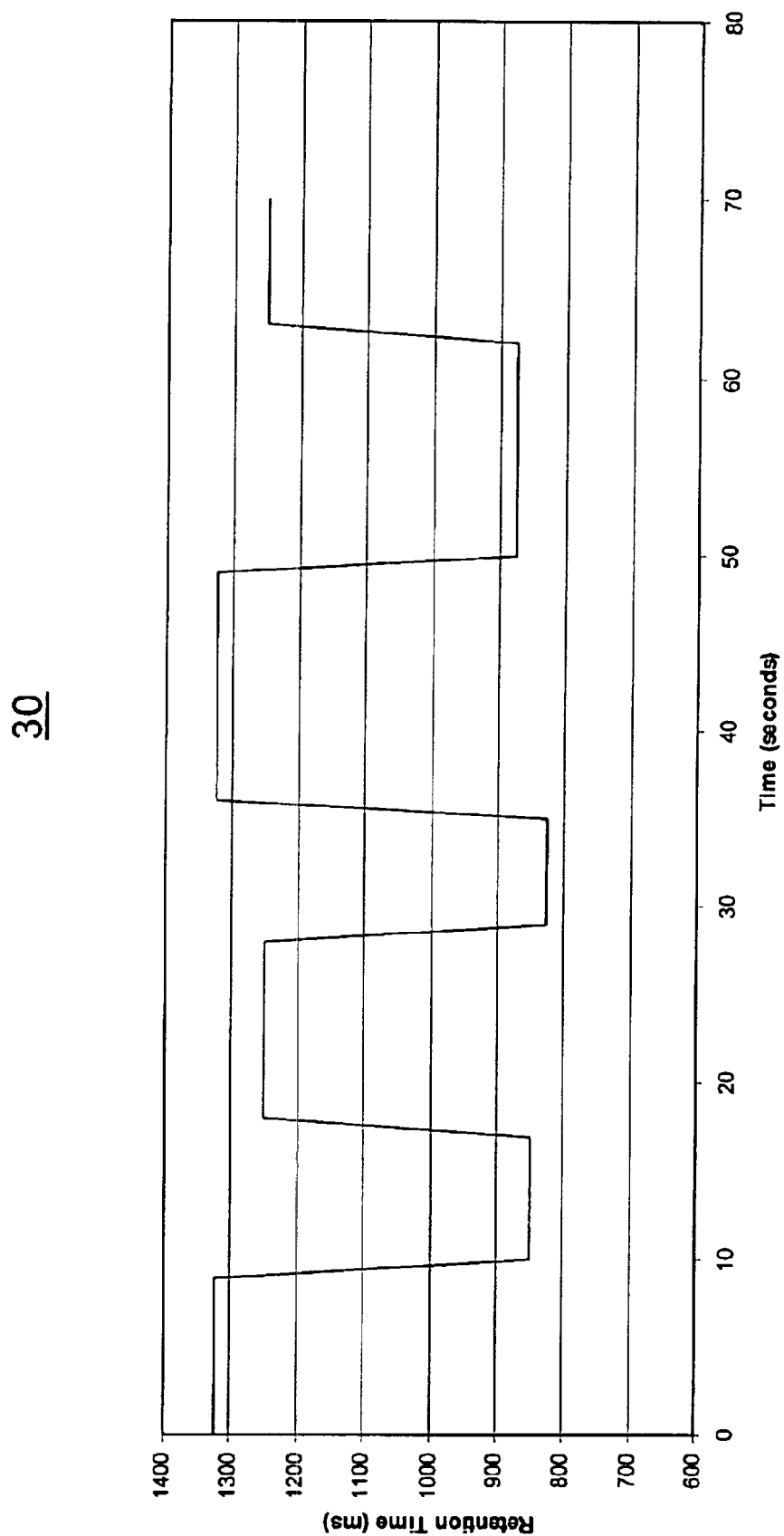

In some cases, the retention time for a given DRAM cell may vary over time at constant temperature. Examples of variable retention time in DRAM cells are illustrated in FIGS. 1–3. FIG. 1, in which a graph of retention time for an individual DRAM cell is referred to by the reference numeral 10, shows the retention time characteristics of a DRAM cell in which retention time is not stable. At any given point in time, the retention time for the cell appears to vary between about 800 ms and about 100 ms. Sometimes the retention time of the cell remains stable for several seconds, but in many cases, only a single sample at a given time may be obtained. One theory is that volatility in DRAM cell retention time increases both with the number of transistor defects and with increasing temperature. One defect in the transistor may result in two distinct refresh states whereas two defects may add additional refresh states. The characteristics represented in FIG. 1 may be present when the DRAM cell is at an elevated temperature, but may not be present when the same DRAM cell is at a lower temperature.

FIG. 2, in which a graph of retention time characteristics is generally referred to by the reference numeral 20, shows a different anomaly in retention time characteristics of a DRAM cell. The graph 20 illustrates the characteristics of a DRAM cell having two relatively stable retention times. The first retention time (shown to be about 120 ms in FIG. 2) remains stable until an external stimulus such as the passage of time occurs. After a period of time, the retention time drops to a relatively stable level of about 48 ms.

FIG. 2 is useful in explaining a major problem with variable retention time. If a DRAM cell having the characteristics shown in FIG. 2 is tested in the early stage of its activation it might pass a refresh specification requiring retention time of no less than, for example, 64 ms. For about the first 20 seconds of the sample period, the refresh time for the cell is slightly under 120 ms. Unfortunately, the DRAM cell would subsequently change and require refresh after about 48 ms, failing a refresh specification requiring a refresh time of 64 ms or higher. The change in retention time could cause data loss if the part having these characteristics is used in a system that refreshes only, for example, every 55 ms.

In FIG. 3, a graph of retention time is generally referred to by the reference numeral 30. FIG. 3 shows the variable retention time for a DRAM cell having performance characteristics more stable than the characteristics depicted in FIG. 1, but less stable than the performance characteristics of the device represented in FIG. 2. The retention time characteristics shown in FIG. 3 seem to remain stable for several seconds and then change dramatically for the next several seconds. The external stimulus responsible for this change may be the passage of time alone or the passage of time combined with some other stimulus that makes retention time more unstable. Other stresses that may make retention time more unstable include a change in device operating temperature or applied voltage stress.

Figure 4:
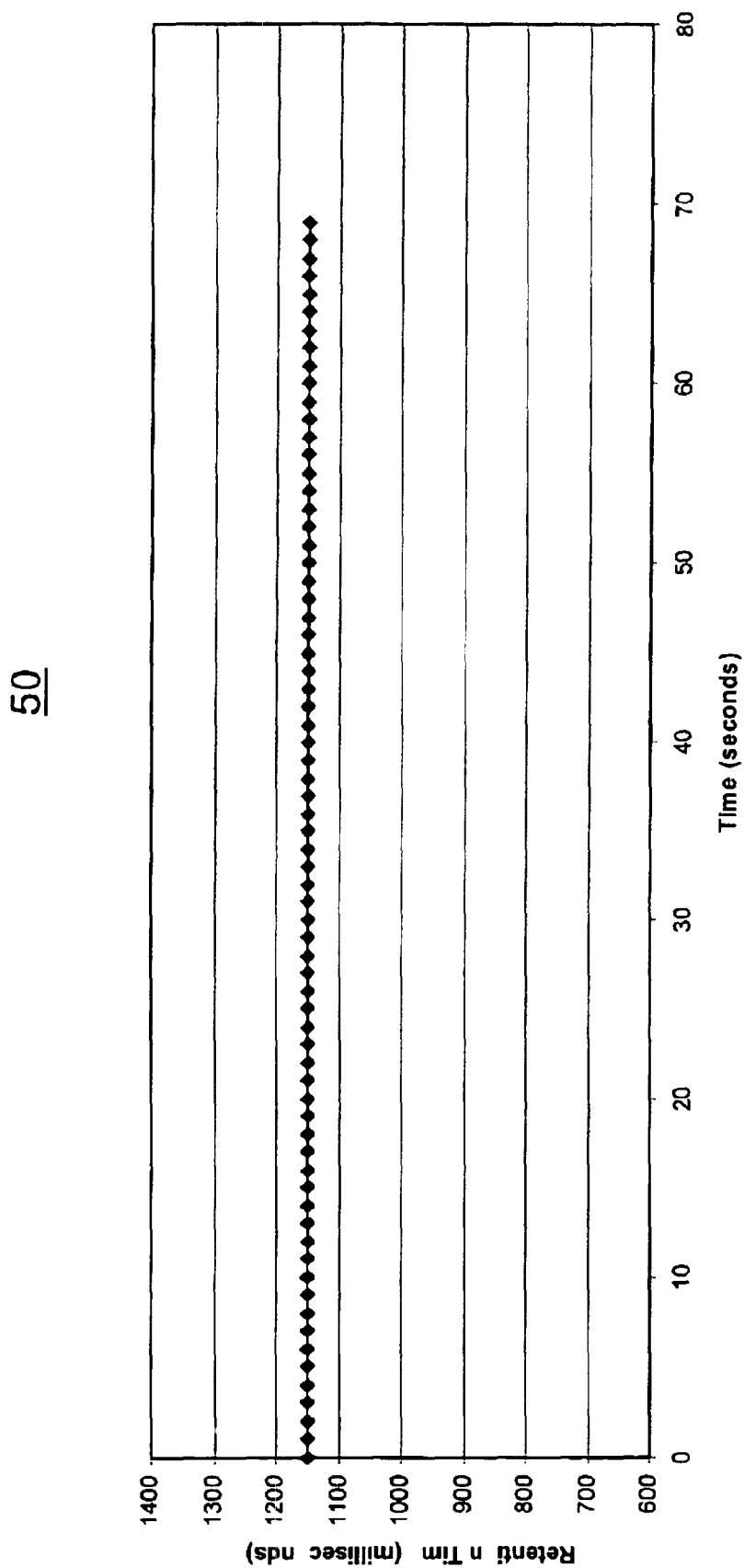
FIG. 4 is a graphical representation showing an example of performance characteristics of a DRAM cell that has relatively stable retention time.

FIG. 4 is a graphical representation showing an example of performance characteristics of a DRAM cell that has relatively stable retention time. The graph illustrated in FIG. 4 is generally referred to by the reference numeral 50. The performance characteristics shown in FIG. 4 are representative of a stable DRAM cell. The present technique changes the performance characteristics of DRAM cells from the less desirable characteristics shown in FIGS. 1–3 to the relatively stable and more desirable performance characteristics represented by the graph 50 (FIG. 4). As can be seen in the graph 50, the retention time of about 1,150 ms is very stable across the entire time span shown. Although the graph 50 illustrates a stable retention time of about 1,150 ms, the level at which retention time is stabilized by the process of the present technique is not believed to be a crucial aspect of the invention.

Figure 5:
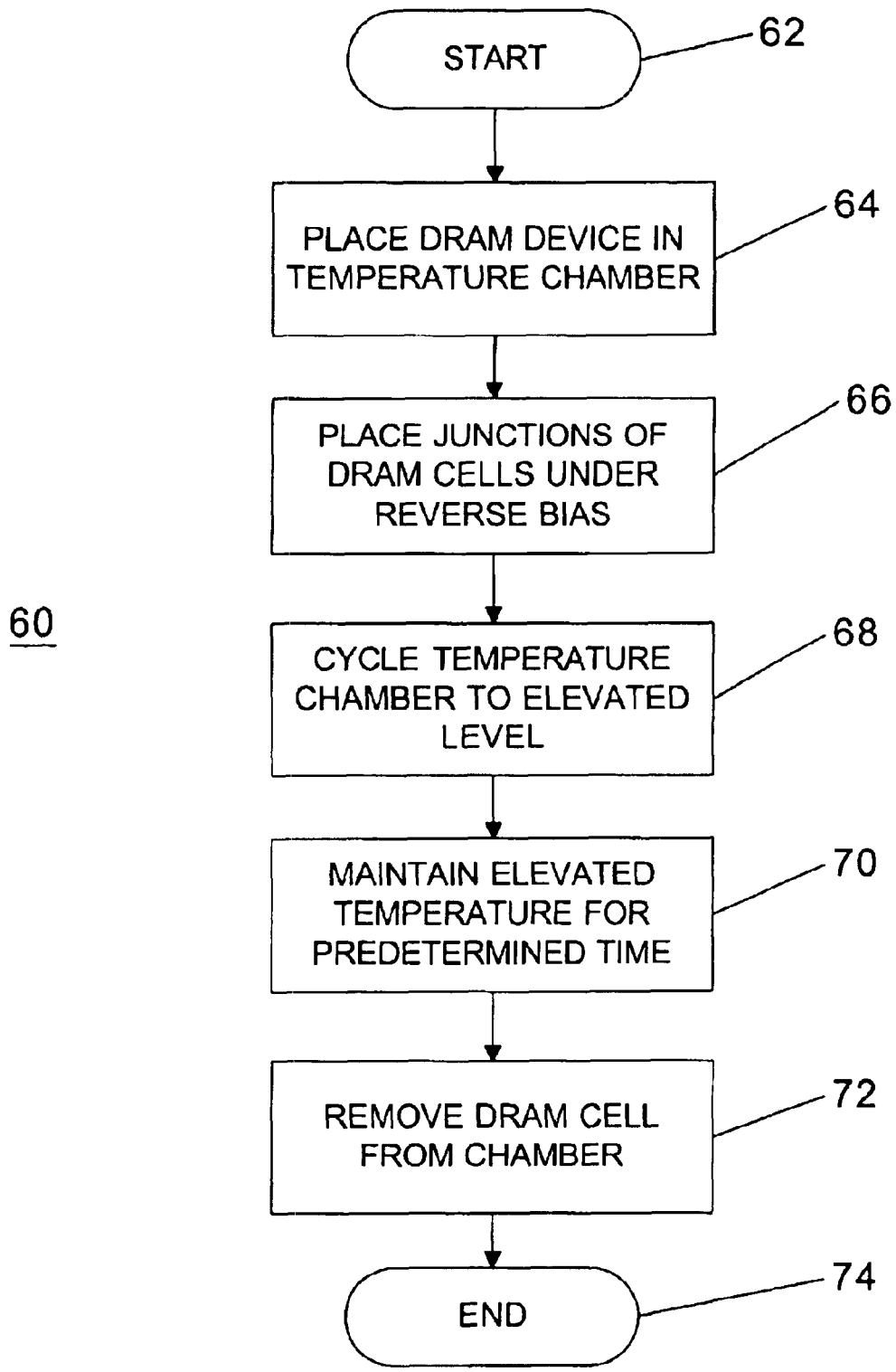
FIG. 5 is a simplified flow chart of the preferred embodiment of the claimed process that reduces variability in DRAM retention time.

FIG. 5 is a process flow diagram that shows an illustrative embodiment of the process of the present technique. The process illustrated in FIG. 5, which is generally referred to by the reference numeral 60, is directed to reducing variation of retention time in metallurgical sets or completed DRAM cells. Expected reduction in variability is demonstrated, for example, by the contrast between FIG. 3 and FIG. 4. The process begins at block 62.

At block 64, an integrated circuit DRAM device is placed into a temperature chamber. The temperature chamber is capable of elevating the temperature of the environment surrounding the DRAM device. Further, the temperature chamber may have the capability of providing electrical signals to the DRAM. The junctions of the transistors of each DRAM cell contained in the DRAM device may be placed in a reverse bias condition, as shown at block 66.

In the reverse-bias condition for a transistor or memory cell, the transistor for each memory cell may act as a short circuit. No current typically flows across the junction because, in a reverse bias condition, the holes and the electrons are not attracted towards each other. In other words, the holes and electrons that could conduct electricity do not conduct because they are biased to move in the wrong direction. Note that if enough reverse (negative) voltage is applied, the junction breaks down and lets current through.

The voltage level at which the junction breaks down is sometimes referred to as the breakdown voltage of the junction. The reverse biasing voltage applied for purposes of the present technique may be less than the breakdown voltage.

In a DRAM memory chip, the capacitors and transistors that make up the memory cells are connected across a bitline. A predetermined voltage through a wordline is used to control the state of the transistor. The bitline is used to write information to the capacitor or read information from the capacitor when the signal on the wordline renders the transistor conductive. There are three terminals on each transistor: one connected to the bitline; another connected to a terminal of the capacitor; and the third connected to the wordline. The transistor acts as a gate between the bitline and the capacitor. The second terminal of the capacitor is connected to a voltage rail or supply voltage. Thus, when the wordline for a particular cell is active, the transistor is in a conducing state and the capacitor is connected to the bitline. The capacitor stores a charge that, depending on whether the polarity of the voltage across the capacitor is positive or negative, represents either a logic high ("1") or a logic low ("0") value.

To maintain reverse bias on the DRAM cells during the period of elevated temperature, one method is to latch a test mode to force all wordlines (rows) and bitlines (columns) high. Another method would be to perform a sticky row condition on all wordlines per digit while writing a logical high ("1") and then repeating for a digit bar. The sticky row condition is a test mode that allows multiple wordlines to be turned on at the same time and puts the bits in high state with reverse bias.

The temperature chamber containing the DRAM device is placed at an elevated temperature level, as shown at block 68. Experimental data has shown that a temperature of approximately 200 degrees C. may cure DRAM cells that exhibit variable retention time characteristics. Temperatures in excess of 200 degrees C. may also cure variable retention time. As shown at block 70, the elevated temperature is maintained for a predetermined period of time. Experimental data has shown that a time of approximately 2 hours is effective for curing DRAM cells that exhibit variable retention time characteristics. Maintaining the elevated temperature for longer than 2 hours may also be effective.

There is a strong correlation with observed silicon defects in the depletion region of the diode p-n junction and variable retention time. One occurrence that may be responsible for variability in retention time is known as a trap-assisted leakage mechanism or metastable leakage. The trap-assisted leakage phenomena may be related to weakly bonded hydrogen atoms that migrate across the p-n junction. Maintaining a DRAM cell transistor under reverse bias for a given time at a given temperature may cure these metastable defects in the p-n junction depletion region. The process of the present technique may sweep these mobile defects out of the depletion region, resulting in reduced variation in DRAM cell retention time.

Although described herein with respect to resolving the issue of variable retention time in DRAM cells, the present technique may applicable to cure metastable defects in general. In other words, the present technique is not limited to curing variable retention time in DRAM cells.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A process comprising the acts of:
   placing a DRAM cell in a reverse bias condition; and
   elevating the surrounding temperature of the DRAM cell for a predetermined period of time.

2. The process of claim 1 wherein the temperature surrounding the DRAM cell is elevated to a predetermined temperature.

3. The process of claim 2 wherein the predetermined temperature is approximately 200 degrees Centigrade.

4. The process of claim 2 wherein the predetermined temperature is greater than 200 degrees Centigrade.

5. The process of claim 1 wherein the predetermined period of time is approximately equal to 2 hours.

6. The process of claim 1 wherein the predetermined period of time is greater than 2 hours.

7. The process of claim 1 in which the recited acts are performed in the recited order.

8. The process of claim 1, wherein variable retention time of the DRAM cell is reduced.

9. The process of claim 1, wherein retention time of the DRAM cell is stabilized.

10. A process that cures defects in an integrated circuit junction, the process comprising the acts of:
    placing the integrated circuit junction in a reverse bias condition; and
    elevating the surrounding temperature of the integrated circuit junction for a predetermined period of time.

11. The process of claim 10 wherein the temperature surrounding the integrated circuit junction is elevated to a predetermined temperature.

12. The process of claim 11 wherein the predetermined temperature is approximately 200 degrees Centigrade.

13. The process of claim 11 wherein the predetermined temperature is greater than 200 degrees Centigrade.

14. The process of claim 10 wherein the predetermined period of time is approximately equal to 2 hours.

15. The process of claim 10 wherein the predetermined period of time is greater than 2 hours.

16. The process of claim 10 in which the recited acts are performed in the recited order.

17. A system for producing an integrated circuit that has stable retention times, the integrated circuit having at least one junction, the system comprising:
    means for placing the junction in a reverse bias condition; and
    means for elevating the surrounding temperature surrounding the integrated circuit for a predetermined period of time.

18. The system of claim 17 wherein the temperature surrounding the integrated circuit is elevated to a predetermined temperature.

19. The system of claim 18 wherein the predetermined temperature is approximately 200 degrees Centigrade.

20. The system of claim 18 wherein the predetermined temperature is greater than 200 degrees Centigrade.

21. The system of claim 17 wherein the predetermined period of time is approximately equal to 2 hours.

22. The integrated circuit device of claim 17 wherein the predetermined period of time is greater than 2 hours.

23. The system of claim 17 in which the recited acts are performed in the recited order.

24. The system of claim 17 wherein the integrated circuit device is a dynamic random access (DRAM) memory.

* * * * *